(12) United States Patent
Stettner et al.

(10) Patent No.: US 12,729,441 B2
(45) Date of Patent: Sep. 8, 2026

(54) METHOD AND DEVICE FOR DEPOSITING AN EPITAXIAL LAYER ON A SUBSTRATE WAFER MADE OF SEMICONDUCTOR MATERIAL

(71) Applicant: Siltronic AG, Munich (DE)

(72) Inventors: Thomas Stettner, Waging am See (DE); Walter Edmaier, Wittibreut (DE)

(73) Assignee: SILTRONIC AG, Munich (DE)

( * ) Notice: Subject to any disclaimer, the term of this patent is extended or adjusted under 35 U.S.C. 154(b) by 730 days.

(21) Appl. No.: 18/247,095

(22) PCT Filed: Sep. 20, 2021

(86) PCT No.: PCT/EP2021/075795
§ 371 (c)(1),
(2) Date: Mar. 29, 2023

(87) PCT Pub. No.: WO2022/069283
PCT Pub. Date: Apr. 7, 2022

(65) Prior Publication Data

US 2023/0366095 A1 Nov. 16, 2023

(30) Foreign Application Priority Data

Sep. 30, 2020 (EP) .................................... 20199291

(51) Int. Cl.
*C23C 16/52* (2006.01)
*C23C 16/455* (2006.01)
(Continued)

(52) U.S. Cl.
CPC ........ *C23C 16/52* (2013.01); *C23C 16/45502* (2013.01); *C23C 16/4583* (2013.01);
(Continued)

(58) Field of Classification Search
None
See application file for complete search history.

(56) References Cited

U.S. PATENT DOCUMENTS 10,597,779 B2 3/2020 Weaver et al.
2001/0008782 A1* 7/2001 Matsuyama ...... C23C 16/45502 438/164
(Continued)

FOREIGN PATENT DOCUMENTS

DE 102011007632 B3 2/2012
DE 112018001223 T5 11/2019
(Continued)

*Primary Examiner* — Jose I Hernandez-Kenney
(74) *Attorney, Agent, or Firm* — LEYDIG, VOIT & MAYER, LTD.

(57) ABSTRACT

A method deposits an epitaxial layer on a semiconductor substrate having a wedge-shaped cross section. The substrate is arranged in a deposition apparatus to rest concentrically on a susceptor held by a supporting shaft. The supporting shaft rotates with a time period. Deposition gas is passed over the substrate between a gas inlet and outlet. Flushing gas is passed along a lower side of a preheating ring and of the susceptor. The supporting shaft is displaced with the time period along a displacement path from a position where a thinner edge of the substrate has its smallest distance from the gas inlet, to where the thinner edge has its largest distance therefrom, and back.

5 Claims, 4 Drawing Sheets

(51) Int. Cl.

| | |
|---|---|
| ***C23C 16/458*** | (2006.01) |
| ***C30B 25/12*** | (2006.01) |
| ***C30B 25/14*** | (2006.01) |
| ***C30B 25/16*** | (2006.01) |
| ***H10P 14/24*** | (2026.01) |
| ***H10P 72/00*** | (2026.01) |
| ***H10P 72/76*** | (2026.01) |

(52) U.S. Cl.
CPC .......... *C23C 16/4584* (2013.01); *C30B 25/12* (2013.01); *C30B 25/14* (2013.01); *C30B 25/16* (2013.01); *H10P 14/24* (2026.01); *H10P 72/0604* (2026.01); *H10P 72/7618* (2026.01)

(56) References Cited

U.S. PATENT DOCUMENTS

2004/0069612 A1 4/2004 Nakata et al.
2009/0269861 A1 10/2009 Kurosawa
2011/0006309 A1* 1/2011 Momose ................ C23C 16/46 257/77
2012/0263875 A1* 10/2012 Brenninger ......... C23C 16/4401 118/728
2013/0167771 A1 7/2013 Yamaguchi et al.
2016/0010239 A1 1/2016 Tong et al.
2018/0096874 A1 4/2018 Schaller et al.
2018/0202070 A1* 7/2018 Asamizu ................ C30B 29/36
2020/0354853 A1 11/2020 Komori
2023/0178398 A1 6/2023 Stettner et al.
2023/0265581 A1* 8/2023 Stettner .................. C30B 25/16 117/86

FOREIGN PATENT DOCUMENTS

JP 2002043230 A 2/2002
JP 2017103396 A 6/2017
JP 2023528172 A 7/2023
JP 2023541796 A 10/2023
WO WO 2018117402 A1 6/2018

* cited by examiner

METHOD AND DEVICE FOR DEPOSITING AN EPITAXIAL LAYER ON A SUBSTRATE WAFER MADE OF SEMICONDUCTOR MATERIAL

CROSS REFERENCE TO RELATED APPLICATIONS

This application is a U.S. National Phase application under 35 U.S.C. § 371 of International Application No. PCT/EP2021/075795, filed on Sep. 20, 2021, and claims benefit to European Patent Application No. EP 20199291.4, filed on Sep. 30, 2020. The International Application was published in German on Apr. 7, 2022 as WO 2022/069283 A1 under PCT Article 21(2).

FIELD

The present disclosure relates to a method and device for depositing an epitaxial layer on a substrate wafer of semiconductor material.

BACKGROUND

Deposition of the epitaxial layer on a substrate wafer of semiconductor material is conventionally carried out by means of chemical vapor deposition (CVD) in a deposition apparatus that can accommodate a substrate wafer. During the deposition of the epitaxial layer, the substrate wafer rests on a susceptor which is held by a supporting shaft and is rotated, a deposition gas being passed over a free upper surface, the front side of the semiconductor wafer. The deposition apparatus conventionally also has a preheating ring, which is arranged around the susceptor while being separated by a gap. An upper dome and a lower dome define a reaction space, inside which the epitaxial layer is deposited on the substrate wafer. Radiant heat of banks of lamps is introduced through one or both domes in order to provide a required deposition temperature. A deposition apparatus having these features is described, for example in US 2016 0 010 239 A1.

Semiconductor wafers with an epitaxial layer (epitaxial wafers) are required for particularly demanding applications in the electronics industry. Correspondingly, the requirements relating to the uniformity of the thickness of such a semiconductor wafer are particularly challenging, for example.

Irregularities in the thickness of the substrate wafer are generally preserved even after the deposition of the epitaxial layer, particularly if the epitaxial layer has a uniform thickness. There are, however, also approaches which have the purpose of improving the thickness uniformity by the deposition of the epitaxial layer.

DE 11 2018 001 223 T5 discloses that a flushing gas, which is passed through the deposition apparatus along a lower side of the preheating ring and a lower side of the susceptor, influences the thickness of the epitaxial layer as well as the width of the gap between the preheating ring and the susceptor.

In US 2009 0 269 861 A1, it is proposed to select the process conditions during the deposition of the epitaxial layer as a function of the planarity of the substrate wafer. Similar proposals are made in WO 2018 117 402 A2 and in JP 2002 43 230 A.

A common feature of these proposals is that they use an effect which occurs as a result of the rotation of the substrate wafer during the deposition of the epitaxial layer: a change of process conditions causes a rotationally symmetrical change of the thickness distribution of the epitaxial layer. These proposals are therefore suitable only for substrate wafers in which the irregularity of the thickness is distributed rotationally symmetrically.

There are, however, also substrate wafers with a thickness distribution that is not rotationally symmetrical. They have a wedge-shaped cross section when the thickness decreases from one region of the circumference to the region of the circumference lying 180° opposite. The cross section from the thinner to the thicker region of such substrate wafers has the shape of a wedge with a thinner edge and a thicker edge. The deposition of an epitaxial layer with a rotationally symmetrical thickness distribution cannot eliminate the wedge-shaped structure.

SUMMARY

In an embodiment, the present disclosure provides a method that deposits an epitaxial layer on a substrate wafer. The substrate wafer is made of semiconductor material and has a wedge-shaped cross section with a thinner edge and a thicker edge. The method includes: arranging the substrate wafer and a susceptor in a deposition apparatus so that the substrate wafer rests concentrically on the susceptor, and so that the susceptor is held by a supporting shaft; rotating the supporting shaft with a time period; passing deposition gas over the substrate wafer in a direction from a gas inlet to a gas outlet; passing flushing gas with a flow rate along a lower side of a preheating ring and a lower side of the susceptor; and displacing the supporting shaft with the time period along a displacement path in a direction starting from an initial position, in which the thinner edge has its smallest distance from the gas inlet, to a final position in which the thinner edge has its largest distance from the gas inlet, and back to the initial position.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
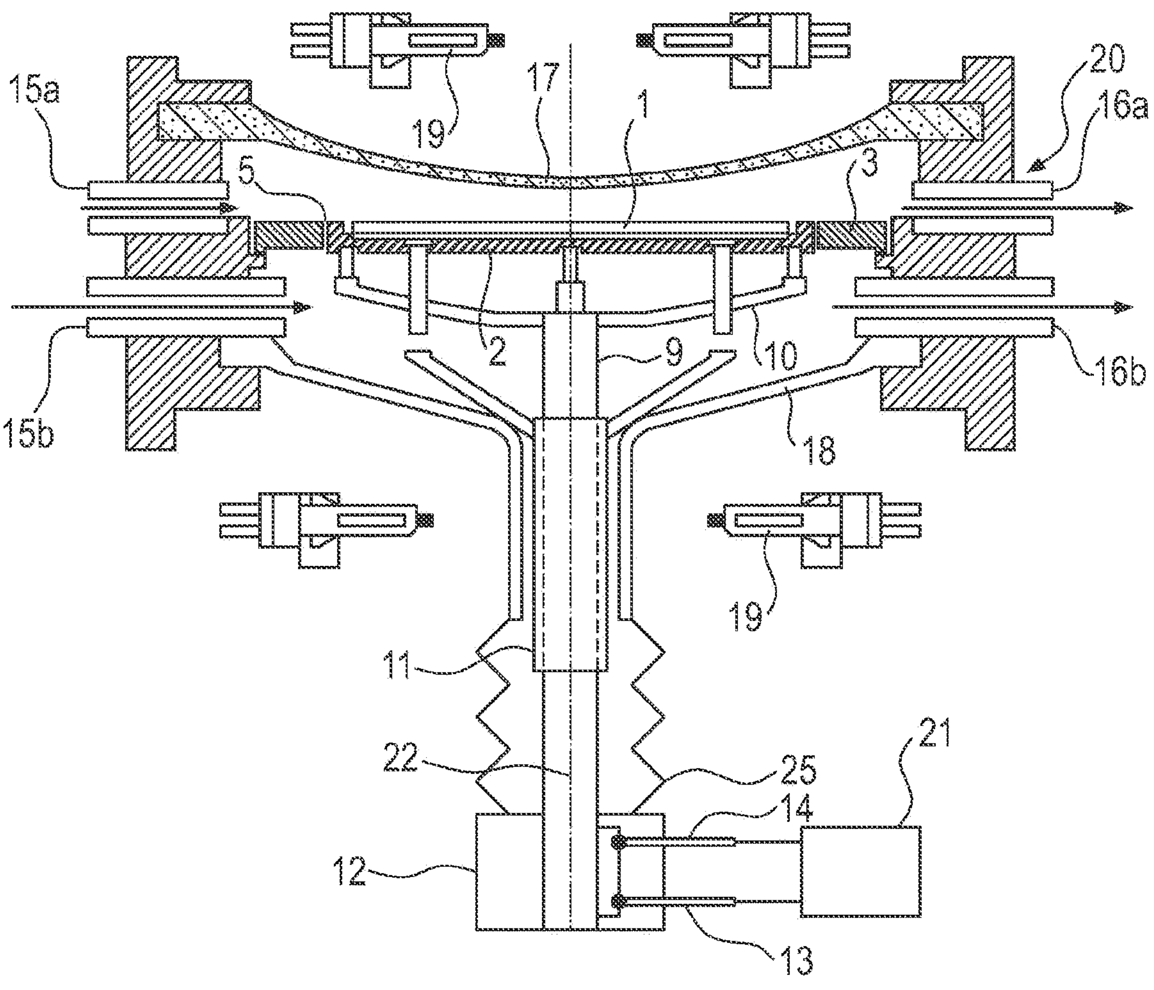
FIG. 1 shows an apparatus, which is configured to carry out the method according to an aspect of the present disclosure.

Aspects of the present disclosure improve the uniformity of the thickness of semiconductor wafers with an epitaxial layer when the substrate wafer has a wedge-shaped cross section.

An embodiment of the present disclosure provides a method for depositing an epitaxial layer on a substrate wafer of semiconductor material, which has a wedge-shaped cross section with a thinner and a thicker edge. The method includes:

- arranging of the substrate wafer and of a susceptor in a deposition apparatus so that the substrate wafer rests concentrically on the susceptor and the susceptor is held by a supporting shaft; rotating of the supporting shaft with a time period;
- passing of deposition gas over the substrate wafer in a direction from a gas inlet to a gas outlet;
- passing of flushing gas with a flow rate along a lower side of a preheating ring and a lower side of the susceptor; and
- displacing of the supporting shaft with the time period along a displacement path in the direction starting from an initial position, in which the thinner edge has a smallest distance from the gas inlet, to a final position in which the thinner edge has a largest distance from the gas inlet, and back to the initial position.

It is observed that flushing gas sometimes enters through the gap between the preheating ring and the susceptor and dilutes the deposition gas, with the effect that the rate of the material deposition decreases. The effect increases with the width of the gap, and this discovery is used according to aspects of the present disclosure.

The width of the gap is periodically increased with the distance of the thinner edge from the gas inlet, and the time period is synchronized with the duration of a rotation of the susceptor, specifically in such a way that the thinner edge of the substrate wafer has the smallest distance from the gas inlet at the start of the period. At this time, the dilution effect is the least and the rate of the material deposition is relatively high. One half of a revolution of the susceptor later, when the thicker edge has the smallest distance from the gas inlet, the gap at this position is relatively large, the dilution effect is relatively pronounced and the material deposition is relatively low. Owing to the procedure according to an aspect of the present disclosure, the epitaxial layer deposited on the substrate wafer has a thickness distribution which also has a wedge-shaped cross section. The latter is complementary to that of the cross section of the substrate wafer, however, so that the wedge shape of the semiconductor wafer with an epitaxially deposited layer is at least less pronounced than that of the substrate wafer. The method implemented according to an aspect of the present disclosure is also suitable for converting a substrate wafer with a wedge-like shape into a semiconductor wafer that has an epitaxial layer and a shape which corresponds to that of a wafer with an approximately plane-parallel front side and back side.

The substrate wafer has a wedge-shaped cross section in the sense of the present disclosure when the edges of the cross section have different thicknesses. A constant increase in the thickness from the thinner edge to the thicker edge is preferred, but not necessary.

The substrate wafer is placed on a susceptor. The susceptor has a circular outer circumference in plan view, and preferably has a pocket and a bearing surface, on which the substrate wafer rests in the edge region of its back side. The substrate wafer lies concentrically with the outer circumference of the susceptor, and preferably rests on its bearing surface in such a way that there is a distance between the back side of the substrate wafer and a bottom delimiting the pocket. Holes may be formed in the bottom of the pocket in order to facilitate the transport of dopants from the back side of the substrate wafer into the reaction space below the susceptor. Instead of the holes, the bottom may consist of a material containing fibers and ensure the transport of dopants because of the porosity of the material.

In order to achieve variation of the width of the gap between the preheating ring and the susceptor in the intended way during the deposition of the epitaxial layer, the supporting shaft, by means of which the susceptor is held, is periodically displaced from an initial position to a final position and back to the initial position. The displacement of the supporting shaft is carried out by means of at least one actuator, for example via one or more piezoelectric adjusting elements. The displacement path between the initial position and the final position runs along a direction between the gas inlet and the gas outlet. As observed over the duration of a revolution of the susceptor, the thinner edge of the cross section of the substrate has the smallest distance from the gas inlet in the initial position and the largest distance from the gas inlet in the final position.

The length of the displacement path from the initial position to the final position is preferably not less than 30% and not more than 130% of the gap width that exists when the outer circumference of the susceptor and the inner circumference of the preheating ring are arranged concentrically. The length of the displacement path is preferably proportional to the difference of the thicknesses at the thicker edge and at the thinner edge of the cross section.

The susceptor is rotated with a rotational speed of preferably from 30 rpm to 60 rpm. With such a rotational speed, the time period of the displacement movement of the susceptor is from 1 s to 2 s.

Preferably, the shape of the substrate wafer is measured before the deposition of the epitaxial layer and process parameters of the deposition, such as the speed of the displacement movement and the flow rate of the flushing gas, are adapted to the shape.

The speed of the displacement movement may be substantially constant or varied in accordance with the profile of the thickness change along the circumference of the substrate wafer.

The flow rate of the flushing gas, which jointly determines the radial range of the effect associated with the dilution of the deposition gas, is preferably not less than 5 standard liters per minute (slm) and not more than 30 slm. It may be constant or varied in accordance with the profile of the thickness change along the circumference of the substrate wafer.

The substrate wafer consists of semiconductor material, preferably monocrystalline silicon, as well as the epitaxial layer which is deposited on the front side of the substrate wafer. The diameter of the substrate wafer is preferably at least 200 mm, particularly preferably at least 300 mm.

The deposition gas contains a compound, for example silane or a chlorosilane, for example trichlorosilane, that contains the semiconductor material, and the flushing gas preferably contains hydrogen.

The periodic displacement, according to an aspect of the present disclosure, of the supporting shaft need not be carried out continuously during the deposition of the epitaxial layer. It may also be carried out only temporarily. Thus, according to a further embodiment of the present disclosure, the epitaxial layer is deposited up to a particular layer thickness without the supporting shaft being periodically displaced, and then the deposition of the epitaxial layer is continued while the supporting shaft is displaced according to the an aspect of the present disclosure. This procedure may also be modified in such a way that the epitaxial layer is initially deposited while the supporting shaft is periodically displaced, and the deposition of the epitaxial layer is thereupon continued without the supporting shaft being displaced. Carrying out one of these embodiments is particularly expedient when the wedge shape of the substrate wafer is relatively weakly pronounced.

An aspect of the present disclosure further provides an apparatus for depositing an epitaxial layer on a substrate wafer of semiconductor material. The apparatus includes:

- a susceptor,
- a preheating ring,
- a supporting shaft,
- at least one actuator for displacement of the supporting shaft, and
- a control device configured for periodic displacement of the supporting shaft by means of the actuator along a direction from a gas inlet to a gas outlet.

According to one preferred embodiment, the apparatus also comprises at least one actuator for tilting of the supporting shaft. After the tilting of the supporting shaft, the rotation axis of the supporting shaft is no longer vertical but is tilted toward the preheating ring.

FIG. 1 shows an apparatus for depositing an epitaxial layer on a substrate wafer of semiconductor material, which is configured to carry out a method according to an aspect of the present disclosure. FIG. 1 is provided in a sectional representation.

The reaction space of this deposition apparatus 20 is delimited at the top by an upper dome 17 and at the bottom by a lower dome 18. A supporting shaft 9, from which supporting arms 10 branch off at an upper and, protrudes into the middle of the reaction space. The supporting arms 10 support a susceptor 2, on which a substrate wafer 1 rests during the deposition of an epitaxial layer. In the embodiment shown, provision is made in the course of loading the deposition apparatus 20, for the substrate wafer 1 to be placed on a lifting shaft 11 and placed on the susceptor 2 by lowering the lifting shaft 11. A preheating ring 3 is arranged between the side wall of the deposition apparatus and the susceptor 2.

The deposition gas is passed over a front side of the substrate wafer, facing toward the upper dome 17, from a gas inlet 15*a* to a gas outlet 16*a*, which are arranged at a side wall of the deposition apparatus. Furthermore provided are also a corresponding gas inlet 15*b* and gas outlet 16*b* for flushing gas, which is passed through the reaction space below the preheating ring 3 and the susceptor 2. Arrows indicate the flow direction of the gas streams. Depending on the width of a gap 5 between the preheating ring and the susceptor, a part of the flushing gas enters the stream of the deposition gas and dilutes the deposition gas.

The reaction space is heated from the outside by banks of lamps 19, which introduce radiant energy through the upper and lower domes 17 and 18. The lower dome 18 of the deposition apparatus 20 is connected to the base 12 by a bellows 25, in order to permit the movement of the supporting shaft 9 and in order to seal the internal space thereby provided against ambient atmosphere flowing in.

A particular feature of the apparatus is a control device 21, which is configured to displace the supporting shaft 9 periodically by means of at least one actuator 13 along a direction from the gas inlet 15*a*, 15*b* to the gas outlet 16*a*, 16*b*. The embodiment shown has two actuators 13 and 14 which, with the same type of activation, displace the supporting shaft 9. Furthermore, tilting of the supporting shaft 9 is also possible when the activation is different. During tilting, the rotation axis 22 of the supporting shaft 9 is inclined from the vertical toward the preheating ring 3. The additional tilting of the supporting shaft 9 may, for example, be useful in order to bring the substrate wafer 1 into a horizontal position if it is not resting horizontally on the susceptor 2 as intended.

Figure 2:
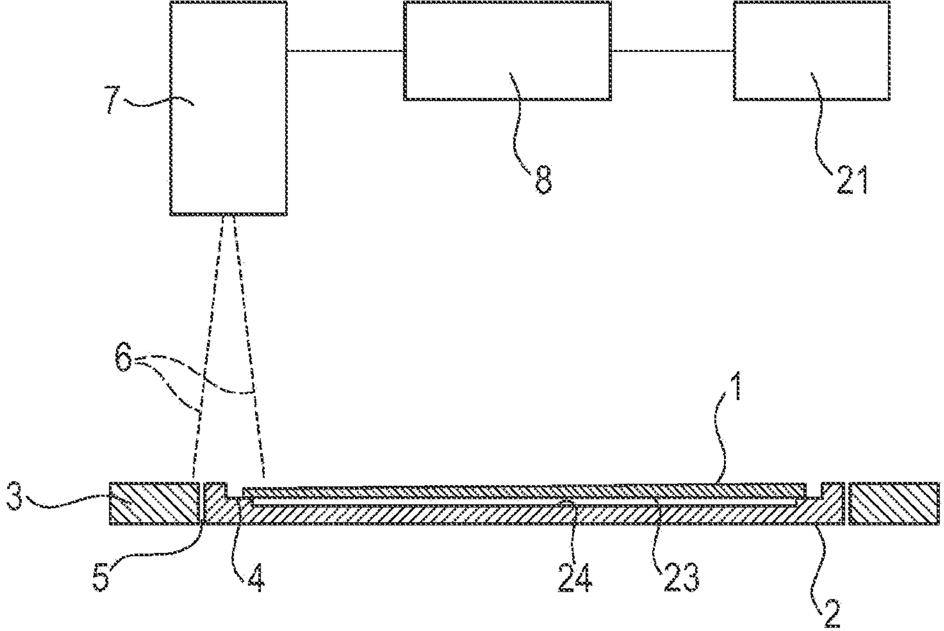
FIG. 2 shows further details of the apparatus of FIG. 1.

It is also advantageous to provide a camera system 7 having image processing 8 in order to check the position of the substrate wafer 1. The camera system 7 shown in FIG. 2 comprises a camera for the observation of an image section 6 during the rotation of the susceptor 2 by means of the supporting shaft 9. The image section 6 acquires a radially extending region which preferably includes a section of the outer circumference of the substrate wafer 1, a section of the outer circumference of the susceptor 2 and a section of the inner circumference of the preheating ring 3, and therefore also a section of the gap 5 between the susceptor 2 and the preheating ring 3.

The substrate wafer 1 rests in a pocket of the susceptor 2 on a bearing surface 4, so that the back side 23 of the substrate wafer 1 has a distance from the bottom 24 of the susceptor 2. The information contained in the image section 6 is evaluated by means of the image processing 8, particularly in relation to the width of the gap 5 and the distance of the camera system 7 from the susceptor 2.

By means of the control device 21, a check is made as to whether there is an incorrect arrangement of the susceptor 2, and if appropriate a signal is generated which tilts the supporting shaft 9 to such an extent that the substrate wafer moves from the incorrect arrangement into the intended horizontal position.

Figure 3:
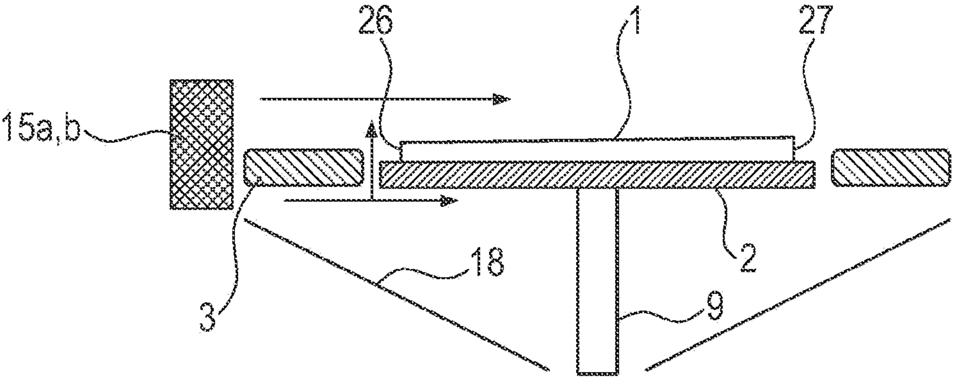
FIG. 3 show the start and the end of the displacement of the supporting shaft in the course of a 180° rotation of the susceptor.
Figure 3:
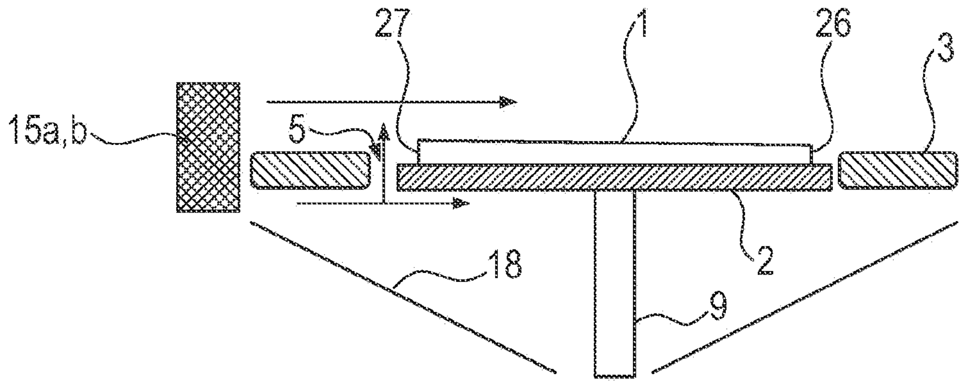

According to an aspect of the present disclosure, the supporting shaft is periodically displaced along a displacement path from an initial position to a final position and back to the initial position. The start (above) and the end (below) of such a movement as far as the final position of the supporting shaft 9 are outlined in FIG. 3.

The substrate wafer 1 rests centrally on the bearing surface of the susceptor 2. It has a wedge-shaped cross section with a thinner edge 26 and a thicker edge 27. In the course of a rotation of the susceptor 1, the thinner edge has the smallest distance from the gas inlet 15*a,b* in the initial position of the supporting shaft 9 and the largest distance from the gas inlet 15*a,b* in the final position of the supporting shaft 9. Because of the displacement of the supporting shaft 9, the gap 5 between the preheating ring 3 and the susceptor 2 is smaller on the side of the gas inlet 15*a,b* in the initial position of the supporting shaft 9, and the effect of dilution by flushing gas which enters the space above the susceptor along the arrow shown as a divided arrow is less. When the thicker edge of the substrate wafer enters the vicinity of the gas inlet 15*a,b* during the rotation of the susceptor 2, the gap 5 is larger and so is the dilution effect. This means that more material is deposited overall in the region of the thinner edge 26 than in the region of the thicker edge 27 of the substrate wafer 1.

Figure 4:
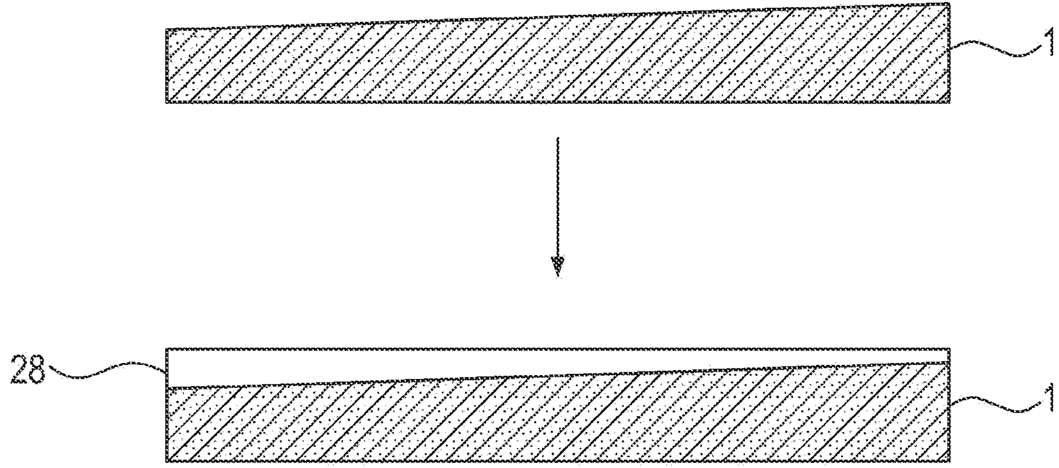
FIG. 4 shows, for comparison, the cross section of a wedge-shaped substrate wafer and that of a substrate wafer coated according to an aspect of the present disclosure.

FIG. 4 represents the way in which the cross section of the substrate wafer with a deposited epitaxial layer (below) changes in comparison with the cross section of the substrate wafer (above). The epitaxial layer 28 likewise has a wedge-shaped cross section, but one which is complementary to that of the substrate wafer 1 so that the coated substrate wafer in the ideal case has plane-parallel side surfaces.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCES USED

1 substrate wafer
2 susceptor
3 preheating ring
4 bearing surface
5 gap
6 image section
7 camera system
8 image processing
9 supporting shaft
10 supporting arm
11 lifting shaft
12 base
13 actuator
14 actuator
15*a,b* gas inlet
16*a,b* gas outlet
17 upper dome
18 lower dome
19 bank of lamps
20 deposition apparatus
21 control device
22 rotation axis
23 back side
24 bottom
25 bellows
26 thinner edge
27 thicker edge
28 epitaxial layer

The invention claimed is:

1. A method for depositing an epitaxial layer on a substrate wafer comprising semiconductor material, the substrate wafer having a wedge-shaped cross section with a thinner edge and a thicker edge, as compared to each other, the method comprising:

arranging the substrate wafer and a susceptor in a deposition apparatus so that the substrate wafer rests concentrically on the susceptor, and so that the susceptor is held by a supporting shaft;

rotating the supporting shaft with a time period;

passing deposition gas over the substrate wafer in a direction from a gas inlet to a gas outlet;

passing flushing gas with a flow rate along a lower side of a preheating ring and a lower side of the susceptor; and displacing the supporting shaft with the time period along a displacement path in a direction starting from an initial position, in which the thinner edge has its smallest distance from the gas inlet, to a final position in which the thinner edge has its largest distance from the gas inlet, and back to the initial position.

2. The method as claimed in claim 1, wherein a length of the displacement path from the initial position to the final position is proportional to a difference between a thicknesses at the thicker edge and a thickness at the thinner edge of the cross section.

3. The method as claimed in claim 1, the method further comprising:

measuring a shape of the substrate wafer before the deposition of the epitaxial layer; and varying a speed of the displacement of the supporting shaft as a function of the shape.

4. The method as claimed in claim 1, the method further comprising:

measuring a shape of the substrate wafer before the deposition of the epitaxial layer; and varying the flow rate of the flushing gas as a function of the shape.

5. The method as claimed in claim 1, wherein the supporting shaft is tilted toward the preheating ring.

* * * * *